May 14, 1963 J. B. CHATTEN 3,089,959

SELF-LIMITING PHOTOMULTIPLIER AMPLIFIER CIRCUIT

Filed May 2, 1960

INVENTOR.
JOHN B. CHATTEN

BY
Robert D. Sanborn
ATTORNEY

United States Patent Office 3,089,959
Patented May 14, 1963

3,089,959

SELF-LIMITING PHOTOMULTIPLIER AMPLIFIER CIRCUIT

John B. Chatten, Philadelphia, Pa., assignor, by mesne assignments, to Philco Corporation, Philadelphia, Pa., a corporation of Delaware Filed May 2, 1960, Ser. No. 25,981
14 Claims. (Cl. 250—207)

The present invention relates to photomultiplier amplifier circuits and more particularly to self-limiting photomultiplier amplifier circuits.

Photomultiplier amplifiers have been employed in conjunction with beam indexing systems of color television reproduction to detect ultra violet indexing signals (hereinafter referred to generally as luminous indexing signals) generated by suitably placed indexing stripes on the screen of the picture tube. In this application the intensity of the luminous energy falling on the photocathode may vary by a factor of 100-to-1 depending upon the intensity of the cathode-ray beam, the portion of the screen being scanned and other factors such as the variation in efficiency in the photo emissive material forming the index stripes. Proper operation of the indexing circuits responsive to this luminous indexing signal require that the variable amplitude luminous energy be converted to a substantially constant amplitude electrical signal at the indexing frequency. The limiting of the electrical indexing signal must be accomplished without appreciable phase shift or time delay. This has been accomplished in the past by cascaded vacuum tube limiting circuits following the photomultiplier tube. These limiting circuits are relatively complex and costly and they are not entirely satisfactory for all applications.

Automatic gain control circuits for controlling the amplitude of the output signals of multi-stage electron multiplier amplifiers per se have been proposed. It has been suggested in the past that a form of limiting action can be obtained in photomultiplier amplifiers by employing a high impedance voltage divider to supply biasing potential to the dynodes near the anode. This means of limiting the dynamic range of the output signal of a photomultiplier amplifier is unsuited for use in indexing systems for color television reproducers since they cannot provide satisfactory limiting action at the relatively high frequencies employed in indexing systems. Means such as voltage regulator tubes in the dynode supply circuit fail to provide sufficient control of the gain, render the circuit unduly complex and/or introduce instabilities or phase shifts which make the known forms of photomultiplier amplifiers generally unsuited for servo loops of the type mentioned above.

Therefore, it is an object of the present invention to provide a self-limiting photomultiplier amplifier which introduces relatively small phase shifts in the signal passing therethrough.

A further object of the present invention is to provide photomultiplier amplifier circuits which are well suited to beam indexing systems of color television reproduction.

Still another object is to provide a photomultiplier amplifier circuit which has very little degeneration of low amplitude input signals but which limits the amplification of high amplitude signals.

In general these and other objects of the invention are achieved by providing a relatively low impedance between successive dynodes in the vicinity of the anode and by selecting the potentials supplied to the dynodes so that the voltage between the final dynode and the anode and/or between final dynode and the next preceding dynode is relatively small compared to the voltage difference between dynodes in the vicinity of the cathode.

For a better understanding of the present invention together with other and further objects thereof reference should now be made to the following detailed description which is to be read in conjunction with the accompanying drawing in which.

Figures 1, 2:
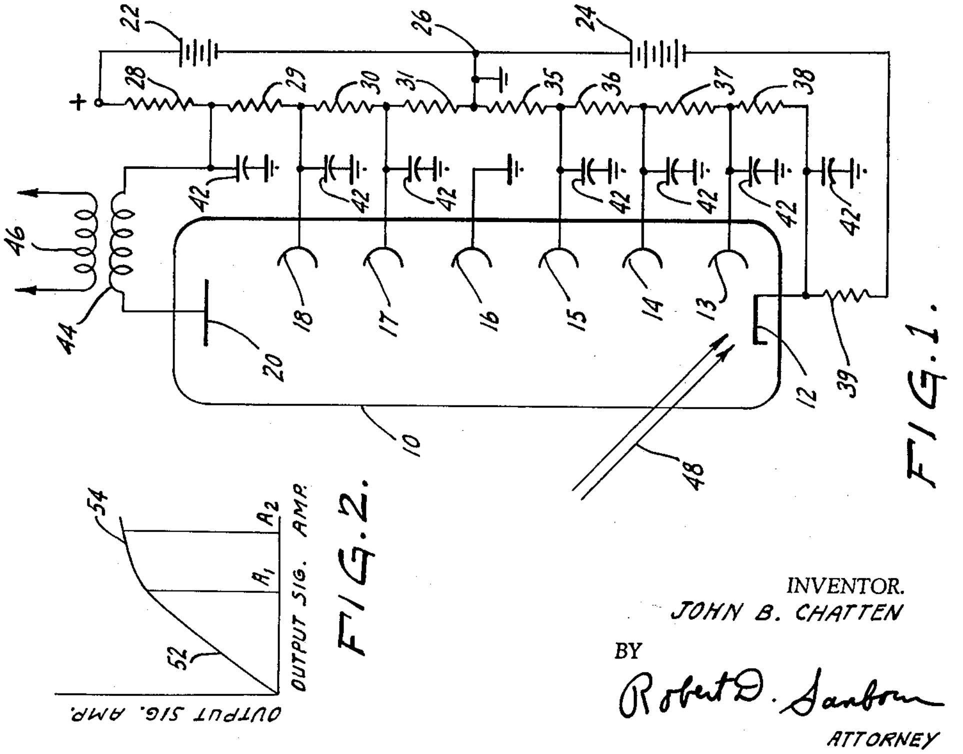
FIG. 1 is a schematic diagram of one preferred form of photomultiplier amplifier arranged in accordance with the present invention.
FIG. 2 is a plot of the large signal characteristic curve of the system of FIG. 1.

In FIG. 1 the photomultiplier tube 10 includes a photo emissive cathode 12, six dynodes 13 through 18, and an anode 20. The bias source for the amplifier circuit of FIG. 1 is schematically represented by batteries 22 and 24. However it is to be understood that in the usual applications of the circuit of FIG. 1, these potentials will be supplied by suitable rectifier circuits. If it is assumed by way of example that phototube 10 is one sold under the commercial type number 6365, source 24 preferably provides a potential of the order of 2,000 volts and source 22 preferably provides a potential of the order of 380 volts. The common terminal 26 of sources 22 and 24 is maintained at ground potential in order to minimize the potential from the anode 20 to ground and to minimize the current requirement of the high voltage power supply.

A voltage divider comprising resistors 28 through 31 is connected between the positive terminal of source 22 and ground. Resistors 28–31 have a resistance such that the bleeder current through these resistors is much greater than the maximum dynode current. Thus the voltage divider formed by resistors 28–31 may be termed a "stiff" voltage divider, i.e. a divider in which the potential at each tap is substantially independent of changes in dynode current. A second voltage divider comprising resistors 35 through 39 is connected between terminal 26 and the negative terminal of source 24. Typical values for the resistors in these two dividers are given in the following table:

| Resistor: | Impedance (ohms) |
|---|---|
| 28 | 1.5K |
| 29 | 6K |
| 30 | 10K |
| 31 | 22K |
| 35 | 820K |
| 36 | 820K |
| 37 | 820K |
| 38 | 1.2M |
| 39 | 470K |

The cathode 12 and each of the dynodes except dynode 16 is bypassed to ground by one of the capacitors 42. Each of the capacitors 42 may have a value of the order of .002 $\mu$f. for an input signal having a frequency of 9 megacycles per second. Dynode 16 is connected directly to ground and hence needs no bypass capacitor. Since the taps on the two voltage dividers 28–31 and 35–38 remain relatively fixed regardless of changes in dynode current, it is obvious that the voltage divider may be replaced by a voltage source having a plurality of taps corresponding in potential to the taps on the voltage divider.

Anode 20 is connected to the junction of resistors 28 and 29 by way of the primary 44 of an interstage coupling transformer. The output signal from the amplifier stage is taken from the secondary 46 of this transformer. The intensity modulated luminous input signal to the amplifier of FIG. 1 is schematically represented by the arrow 48.

The general principles of operation of a photomultiplier amplifier circuit are well known and hence require no description. The circuit thus far described differs from conventional photomultiplier amplifier circuits in that the voltage between the final dynode and the anode is much lower than the voltage between successive dynodes. Furthermore this voltage is substantially independent of anode or dynode current. This is accomplished by making the voltage divider across the low voltage source 22 a relatively low impedance so that the bleeder current through the voltage dividers 28, 29, 30 and 31 is relatively large compared to the maximum dynode current which flows from dynode 18. In the example given above, the voltage between dynode 18 and anode 20 is of the order of 50 volts. The voltage between successive dynodes is of the order of 100 volts. The voltage between cathode 12 and the first dynode 13 is somewhat greater than 100 volts. The photomultiplier circuit described above has the non-linear transfer characteristic shown in FIG. 2. For input signal amplitudes, i.e. light intensities, up to the value $A_1$ the gain of the photomultiplier amplifier is relatively high as represented by the slope of the curve 52. The slope of the portion 54 of the characteristic is much lower than that of portion 52. Thus signals having an amplitude such as $A_2$ will be clipped or peak limited by this non-linear characteristic. It is believed that the limiting which occurs for large signals is caused by space charge limitation of the current in the final interelectrode spaces. However applicant does not wish to be limited by this explanation of the observed operation of this circuit.

It has been determined empirically that the specific non-linear transfer characteristic of the amplifier can be controlled to some extent by choice of the interelectrode voltages between the dynodes 16, 17 and 18 and between dynode 18 and anode 20. Tests on photomultiplier tubes bearing the commercial type number 6365 have indicated that a useful non-linear characteristic is obtained for a final dynode-to-anode voltage in the range from 30 to 60 volts with optimum operation being obtained at approximately 50 volts. It has been found that a photomultiplier amplifier having the characteristics mentioned above is capable of reducing the dynamic range of the signals passing therethrough by a factor of more than ten.

Figure 3:
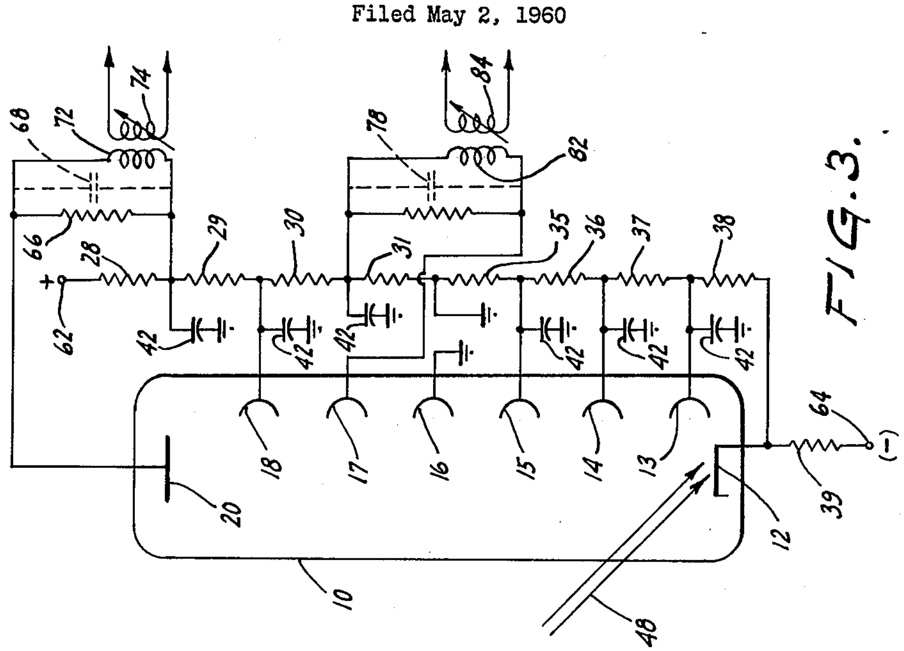
FIG. 3 is a partial schematic diagram of a circuit for obtaining two signals at different amplitude levels and different frequencies from the same photomultiplier circuit.

FIG. 3 is a schematic diagram similar to FIG. 1 of a second preferred embodiment of the invention which provides output signals at two different frequencies. Parts in FIG. 3 corresponding to like parts in FIG. 1 have been identified by the same reference numerals. Bias sources 22 and 24 of FIG. 1 have been schematically represented by terminals 62 and 64, respectively, in FIG. 3. In the circuit of FIG. 3, the anode 20 is connected to the junction of resistors 28 and 29 by a frequency selective circuit which is diagrammatically represented by winding 72 and circuit capacitance 68 in shunt therewith. A resistor 66 provides sufficient damping to obtain the desired bandwidth. A secondary winding 74 is coupled to primary winding 72 to provide means for obtaining an output signal from the circuit. The output circuit 66—72—74 may be tuned to resonate at one of the component frequencies of the luminous signal represented schematically by arrow 48. By way of an example, it may be tuned to resonate at a frequency of 9 megacycles per second. It is to be understood that in practice the output circuit may be a double tuned interstage coupling circuit or the like.

In the circuit of FIG. 3 the direct connection from dynode 17 to the junction of resistors 30 and 31 is replaced by a second coupling circuit of the type just described. This second coupling circuit comprises resistor 76, circuit capacitance 78, primary winding 82 and secondary winding 84. This second coupling circuit may be tuned to a different frequency than the first-mentioned coupling circuit. For example, it may be tuned to 6 megacycles.

It is believed that the operation of the circuit of FIG. 3 is obvious from the description of the operation of the circuit of FIG. 1. It is to be understood that an output signal at the two different frequencies can be obtained only if the component frequencies are present in the luminous signal supplied to the cathode 12. If the potential between dynodes 16 and 17 is made substantially equal to the potentials appearing between the dynodes 13 through 16, respectively, there will be no appreciable limiting of the signal supplied at transformer winding 84.

While there have been described what are at present believed to be the preferred embodiments of the invention, it will be apparent that various modifications and other embodiments thereof will occur to those skilled in the art within the scope of the invention. Accordingly I desire the scope of my invention to be limited only by the appended claims.

I claim:

1. A photomultiplier amplifier circuit comprising a photomultiplier amplifier tube having as electrodes an anode, a cathode and a plurality of dynodes, said photomultiplier amplifier tube being subject to limiting of electron current flow in an interelectrode space thereof in response to a potential difference between the final dynode and an adjacent electrode which is less than a first value, a source of bias potential having a plurality of taps, means coupling said cathode, said anode and said dynodes to selected taps on said bias source, said means coupling said anode to said bias source including means for deriving an output signal from said amplifier circuit, said bias source including means for causing said taps to be at different potentials, said last mentioned means causing the potential difference between the said taps connected to said final dynode and said adjacent electrode to be substantially less than the potential difference between taps associated with other adjacent electrodes of said photomultiplier amplifier tube and less than said first value.

2. A photomultiplier circuit as in claim 1 wherein said adjacent electrode is said anode and wherein space charge limiting occurs in the final interelectrode space of said amplifier tube.

3. A photomultiplier amplifier circuit as in claim 1 wherein said adjacent electrode is the preceding dynode and wherein limiting occurs in the interelectrode space between said final dynode and said preceding dynode.

4. A photomultiplier amplifier circuit comprising a photomultiplier amplifier tube having an anode, a cathode and a plurality of dynodes, said photomultiplier amplifier tube being subject to limiting of electron current flow in an interelectrode space thereof in response to a potential difference between the final dynode and an adjacent electrode which is less than a first value, a source of bias potential, a tapped voltage divider connected to the terminals of said source of bias potential, means coupling said cathode, said anode and said dynodes to selected taps on said voltage divider, said means coupling said anode to said voltage divider including means for deriving an output signal from said amplifier circuit, the position of said taps on said voltage divider being such that the potential between the final dynode and an adjacent electrode is substantially less than the potential difference between other adjacent electrodes of said tube and less than said first value.

5. A photomultplier amplifier circuit comprising a photomultiplier amplifier tube having an anode, a cathode and a plurality of dynodes, said photomultiplier amplifier tube being subject to limiting of electron current flow in the final interelectrode space thereof in response to a potential difference between the final dynode and said anode which is less than a first value, a source of bias potential, a tapped voltage divider connected to the terminals of said source of bias potential, means coupling said cathode, said anode and said dynodes to selected taps on said voltage divider, said means coupling said anode to said voltage divider including means for deriving an output signal from said amplifier circuit, the position of the said taps on said voltage divider being such that the potential between said anode and the final dynode is substantially less than the potential difference between other adjacent electrodes of said tube and less than said first value which will cause space charge limiting of electron flow in the final interelectrode space of said amplifier tube, the impedance of said voltage divider being such that the bleeder current component through said voltage divider is substantially greater than the maximum dynode current component flowing in said voltage divider.

6. A photomultiplier amplifier circuit comprising a photomultiplier amplifier tube having an anode, a cathode and a plurality of dynodes, a source of bias potential, a tapped voltage divider connected to the terminals of said source of bias potential, means coupling said cathode, said anode and said dynodes to selected taps on said voltage divider, said means coupling said anode to said voltage divider including means for deriving an output signal from said amplifier circuit, the position of said taps on said voltage divider being such that the potential between said anode and the final dynode is substantially less than the potential between successive dynodes, the impedance of said voltage divider being such that the bleeder component of current through said voltage divider is substantially greater than the maximum dynode current component through said voltage divider.

7. A photomultiplier amplifier circuit comprising a photomultiplier amplifier tube having an anode, a cathode and a plurality of dynodes, a source of bias potential having first and second terminals of opposite polarity and a third terminal at a potential intermediate said first and second terminals, a first tapped voltage divider connected between said first terminal and said third terminal, a second tapped voltage divider connected between said second terminal and said third terminal, an intermediate one of said dynodes being connected to said third terminal of said source of bias potential, means coupling said cathode and the dynodes between said cathode and said intermediate dynode to selected taps on said second voltage divider, means coupling said anode and the dynodes between said intermediate dynode and said anode to selected taps on said first voltage divider, said means coupling said anode to said first voltage divider including output signal coupling means, the said taps on said two voltage dividers being selected so that the potential between said anode and the final dynode is such as to cause space charge limiting of electron flow in the final interelectrode space of said amplifier tube, the impedance of said first voltage divider being such that the bleeder component of current through said first voltage divider is large compared to the maximum dynode current component through said first voltage divider.

8. A photomultiplier amplifier circuit comprising a photomultiplier amplifier tube having an anode, a cathode and a plurality of dynodes, a source of bias potential having first and second terminals of opposite polarity and a third terminal at a potential intermediate said first and second terminals, a first tapped voltage divider connected between said first terminal and said third terminal, a second tapped voltage divider connected between said second terminal and said third terminal, an intermediate one of said dynodes being connected to said third terminal of said bias source, means coupling said cathode and the dynodes between said cathode and said intermediate dynode to selected taps on said second voltage divider, means coupling said anode and the dynodes between said intermediate dynode and said anode to selected taps on said first voltage divider, said means coupling said anode to said first voltage divider including output signal coupling means, the said taps on said voltage divider being so selected that the potential between said anode and the final dynode is substantially less than the potential between successive dynodes, the impedance of said first voltage divider being such that the bleeder current component through said voltage divider is substantially greater than the maximum dynode current component through said first voltage divider.

9. A photomultiplier amplifier circuit comprising a photomultiplier amplifier tube having an anode, a cathode and a plurality of dynodes, a source of bias potential, said source of bias potential having first and second terminals of opposite polarity and a third terminal at a potential intermediate that of said first and second terminals, a first tapped voltage divider coupled between said first terminal and said third terminal, a second tapped voltage divider connected between said second terminal and said third terminal, means coupling an intermediate dynode to said third terminal of said bias source, means coupling said cathode and the dynodes between said cathode and said intermediate dynode to selected taps on said second voltage divider, means coupling the dynodes between said intermediate dynode and said anode to selected taps on said first voltage divider, means including an interstage coupling transformer coupling said anode to a selected tap on said first voltage divider, the impedances between taps on said first voltage divider being selected so that the potential between said anode and the final dynode is substantially less than the potential between successive dynodes, and so that the bleeder component of current through said first voltage divider is substantially greater than the maximum dynode component of current through said first voltage divider.

10. A photomultiplier amplifier circuit as in claim 9, wherein said means coupling one of said dynodes intermediate said intermediate dynode and said anode to said first voltage divider includes a second interstage coupling transformer and wherein said first and second interstage coupling transformers are tuned to resonate at different frequencies.

11. A photomultiplier amplifier circuit comprising a photomultiplier amplifier tube having as electrodes an anode, a cathode and a plurality of dynodes, a source of bias potential having a plurality of taps, said bias source including means for causing said taps to be at different potentials, means coupling said cathode, said anode and said dynode to selected taps on said bias source, said means coupling said anode to said bias source including means for deriving an output signal from said amplpifier circuit, the potential difference between the taps associated with the final dynode and an adjacent electrode being not greater than the approximately six-tenths the potential difference between other adjacent electrodes of said tube whereby limiting of the electron flow occurs in the interelectrode space across which said lower potential exists.

12. A photomultiplier amplifier circuit as in claim 11, wherein said potential difference between said final dynode and said adjacent electrode is from three-tenths to six-tenths the potential difference between the adjacent dynodes in the vicinity of said cathode.

13. A photomultiplier amplifier circuit comprising a photomultiplier amplifier tube having as electrodes an anode, a cathode and a plurality of dynodes, a source of bias potential having at least first and second terminals, a tapped voltage divider connected to said terminals of said source of bias potential, means coupling said cathode, said anode and said dynodes to selected taps on said voltage divider, said means coupling said anode to said voltage divider including means for deriving an output signal from said amplifier circuit, the position of said taps on said voltage divider being such that the potential difference between the final dynode and an adjacent electrode is not greater than the approximate six-tenths the potential differences between other adjacent electrodes of said tube.

14. A photomultiplier amplifier circuit comprising a photomultiplier amplifier tube having as electrodes an anode, a cathode and a plurality of dynodes, a source of bias potential having at least first and second terminals, a tapped voltage divider connected to the terminals of said source of bias potential, means coupling said cathode, said anode and said dynodes to selected taps on said voltage divider, said means coupling said anode to said voltage divider including means for deriving an output signal from said amplifier circuit, the position of said taps on said voltage divider being such that the potential difference between said anode and the final dynode is not greater than approximately six-tenths the potential differences between adjacent dynodes of said tube, the impedance of said voltage divider being such that the bleeder current component through said voltage divider is substantially greater than the maximum dynode current component flowing in said voltage divider.

References Cited in the file of this patent

UNITED STATES PATENTS

| | | |
|---|---|---|
| 2,625,653 | Wouters | Jan. 13, 1953 |
| 2,815,453 | Colson et al. | Dec. 3, 1957 |